(12) United States Patent
Ding et al.

(10) Patent No.: US 8,319,564 B2
(45) Date of Patent: Nov. 27, 2012

(54) INTEGRATED CIRCUITS WITH CONFIGURABLE INDUCTORS

(75) Inventors: Weiqi Ding, Fremont, CA (US); Sergey Shumarayev, Los Altos Hills, CA (US); Wilson Wong, San Francisco, CA (US); Ali Atesoglu, Milpitas, CA (US); Sharat Babu Ippili, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 112 days.

(21) Appl. No.: 12/748,261

(22) Filed: Mar. 26, 2010

(65) Prior Publication Data
US 2011/0234331 A1    Sep. 29, 2011

(51) Int. Cl.
H03B 5/12    (2006.01)
H03L 1/00    (2006.01)

(52) U.S. Cl. ........... 331/49; 331/2; 331/56; 331/117 FE; 331/179; 331/186

(58) Field of Classification Search ........ 331/2, 46, 331/48, 49, 56, 117 FE, 117 R, 179, 185, 331/186
See application file for complete search history.

(56) References Cited

U.S. PATENT DOCUMENTS

| | | | |
|---|---|---|---|
| 4,626,816 A | 12/1986 | Blumkin et al. | |
| 5,610,433 A | 3/1997 | Merrill et al. | |
| 5,686,864 A * | 11/1997 | Martin et al. | 331/1 A |
| 6,114,915 A | 9/2000 | Huang et al. | |
| 6,150,891 A | 11/2000 | Welland et al. | |
| 6,512,420 B1 * | 1/2003 | Eker et al. | 331/57 |
| 6,512,801 B1 * | 1/2003 | Ninomiya | 375/316 |
| 6,861,913 B1 | 3/2005 | Herzel et al. | |
| 6,946,924 B2 * | 9/2005 | Chominski | 331/177 V |
| 7,135,951 B1 | 11/2006 | Sidhu | |
| 7,414,490 B2 * | 8/2008 | Jeon et al. | 331/179 |
| 7,590,211 B1 | 9/2009 | Burney | |
| 7,940,140 B2 * | 5/2011 | Zeng et al. | 331/179 |
| 8,068,003 B2 * | 11/2011 | Chen et al. | 336/200 |
| 2003/0202331 A1 | 10/2003 | Jessie et al. | |
| 2006/0158268 A1 | 7/2006 | McCorquodale et al. | |
| 2007/0132524 A1 | 6/2007 | Kishino | |
| 2008/0122029 A1 * | 5/2008 | Wang et al. | 257/531 |

OTHER PUBLICATIONS

Watt, Jeffrey T., et al. U.S. Appl. No. 12/363,545, filed Jan. 30, 2009.
Chen, Shuxian, et al. U.S. Appl. No. 12/623,161, filed Nov. 20, 2009.
Chen, Shuxian, et al. U.S. Appl. No. 12/721,402, filed Mar. 10, 2010.
Geen et al., "Miniature Multilayer Spiral Inductors for GaAs MMICs," GaAs IC Symposium, 1989.

* cited by examiner

*Primary Examiner* — Levi Gannon
(74) *Attorney, Agent, or Firm* — Treyz Law Group; Jason Tsai

(57) ABSTRACT

Integrated circuits with phase-locked loops are provided. Phase-locked loops may include an oscillator, a phase-frequency detector, a charge pump, a loop filter, a voltage-controlled oscillator, and a programmable divider. The voltage-controlled oscillator may include multiple inductors, an oscillator circuit, and a buffer circuit. A selected one of the multiple inductors may be actively connected to the oscillator circuit. The voltage-controlled oscillators may have multiple oscillator circuits. Each oscillator circuit may be connected to a respective inductor, may include a varactor, and may be powered by a respective voltage regulator. Each oscillator circuit may be coupled to a respective input transistor pair in the buffer circuit through associated coupling capacitors. A selected one of the oscillator circuits may be turned on during normal operation by supplying a high voltage to the selected one of the oscillator circuit and by supply a ground voltage to the remaining oscillator circuits.

20 Claims, 9 Drawing Sheets

INTEGRATED CIRCUITS WITH CONFIGURABLE INDUCTORS

BACKGROUND

This relates generally to integrated circuits, and more particularly, to integrated circuits with configurable inductors.

Integrated circuits often have inductors. Inductors may be used in oscillators. For example, inductors may be used in LC-based voltage controlled oscillators for circuits such a phase-locked loops. LC-based voltage-controlled oscillators (e.g., voltage-controlled oscillators that include inductors and capacitors) may exhibit high quality factors and desirable phase noise and jitter performance in comparison to ring-based voltage-controlled oscillators.

The operating frequency range of a phase-locked loop may be limited by the frequency tuning range of its voltage-controlled oscillator. A conventional LC-based voltage-controlled oscillator generally has a fixed inductor (i.e., an inductor that has a fixed inductance value) and a varactor (i.e., a voltage-controlled capacitor). Because the value of the inductance is fixed, the frequency tuning range of the oscillator is limited by the amount of capacitance tuning that can be achieved using the varactor.

It would therefore be desirable to be able to provide improved inductor circuits such as inductor circuits that are able to exhibit adjustable inductances.

SUMMARY

Integrated circuits may be provided with configurable inductors. The inductors may have inductance values that can be adjusted through combinations of mask programming and switching circuit reconfiguration. The inductors may be included on integrated circuits that include oscillators such as voltage-controlled oscillators. Voltage-controlled oscillators may be used in integrated circuits such as integrated circuits that include wireless communications circuits.

Integrated circuits having wireless communications capabilities may include phase-locked loops. A phase-locked loop may include an oscillator, a phase-frequency detector, a charge pump, a loop filter, a voltage-controlled oscillator, and a programmable divider connected in a feedback configuration. The oscillator may provide a reference clock signal. The phase-locked loop may generate an output clock signal with a clock rate that is an integer multiple of the clock rate of the reference clock signal.

Configurable inductors may be used in circuits such as voltage-controlled oscillators. A voltage-controlled oscillator may, for example, include a configurable inductor formed from multiple inductors in a dielectric stack on the surface of an integrated circuit substrate. The voltage-controlled oscillator may also include an oscillator circuit and a buffer circuit. A selected one of the multiple inductors may be connected to the oscillator circuit during normal operation. The oscillator circuit may feed signals to the buffer circuit. The buffer circuit may generate the output clock signal having a desired clock rate.

With one suitable arrangement, conductive lines may be formed between the selected one of the inductors (i.e., a selected inductor structure) to the oscillator circuit. The remaining inductors (i.e., remaining inductor structures) may have no conductive lines formed between their terminals and the oscillator circuit (e.g., the remaining inductors may have floating terminals).

If desired, conductive lines may be formed between each of the multiple inductors and the oscillator circuit. One set of vias may be formed in the dielectric stack to connect a selected one of the multiple inductors to the associated conductive lines. The remaining inductors may not be connected by vias to their associated conductive lines. The selected inductor connected may provide the desired frequency range.

The oscillator circuit may be powered by a voltage regulator. The voltage regulator may be controlled by data bits stored in memory elements to provide a desired regulated voltage for the oscillator circuit. The regulated voltage may be provided over an oscillator power supply line. The oscillator circuit may include first and second transistor pairs coupled between the oscillator power supply line and a ground power supply line. Each transistor pair may have a p-channel transistor and an n-channel transistor connected in series at an intermediate node. The transistors in the first transistor pair may have gates connected to the intermediate node of the second transistor pair. The transistors in the second transistor pair may have gates connected to the intermediate node of the first transistor pair.

The selected one of the multiple inductors may be connected between the two intermediate nodes. A varactor (a voltage-controlled capacitor) may be connected between the two intermediate nodes. The intermediate nodes of the first and second transistor pairs serve as first and second outputs of the oscillator circuit, respectively.

In a scenario in which only one oscillator circuit is present, the buffer circuit may include first and second load resistors, an input transistor pair (e.g., first and second input transistors), and a tail current source. The first load resistor and the first input transistor may be connected in series at a first output node. The second load resistor and the second input transistor may be connected in series at a second output node. The pair of input transistors may each have a gate that is respectively coupled to the first and second outputs of the oscillator circuit through associated coupling capacitors.

The first and second input transistors may have source terminals that are connected to a tail node. The tail node may be connected to the ground power supply line through the tail current source. The first and second output nodes may serve as a differential output at which the output clock signal is provided.

In another scenario in which multiple oscillator circuits are present, each oscillator circuit may be supplied with a power supply voltage from a respective voltage regulator. Each oscillator circuit may be connected to a respective inductor. The buffer circuit may have the same number of input transistor pairs as there are oscillator circuits. Each oscillator circuit may have outputs that are coupled to respective input transistor pairs of the buffer circuit through associated coupling capacitors.

The inductors may have any desired number of turns, sizes, shapes, etc. The inductors may be formed using conductive lines that are formed in multiple metal routing layers and that are shorted in parallel to improve inductor quality factor. Any desired frequency range may be covered in an oscillator-based circuit by using a configurable inductor arrangement based on a sufficient number of inductors. The operating frequency of a phase-locked loop circuit or other oscillator circuit may also be shifted and adjusted by tuning an associated varactor and voltage regulator (i.e., in addition to any inductance changes that are made by adjusting the configurable inductor).

Further features of the present invention, its nature and various advantages will be more apparent from the accompanying drawings and the following detailed description.

DETAILED DESCRIPTION

This relates to integrated circuits and inductors for integrated circuits. The inductors may be used in circuits such as LC-based oscillator circuits. Oscillator circuits such as these may be used in integrated circuits with wireless communications circuitry. The integrated circuits in which the wireless communications circuitry is provided may be any suitable type of integrated circuit, including processors, memory chips, programmable integrated circuits, application-specific integrated circuits, audio and video circuits, etc.

Figure 1:
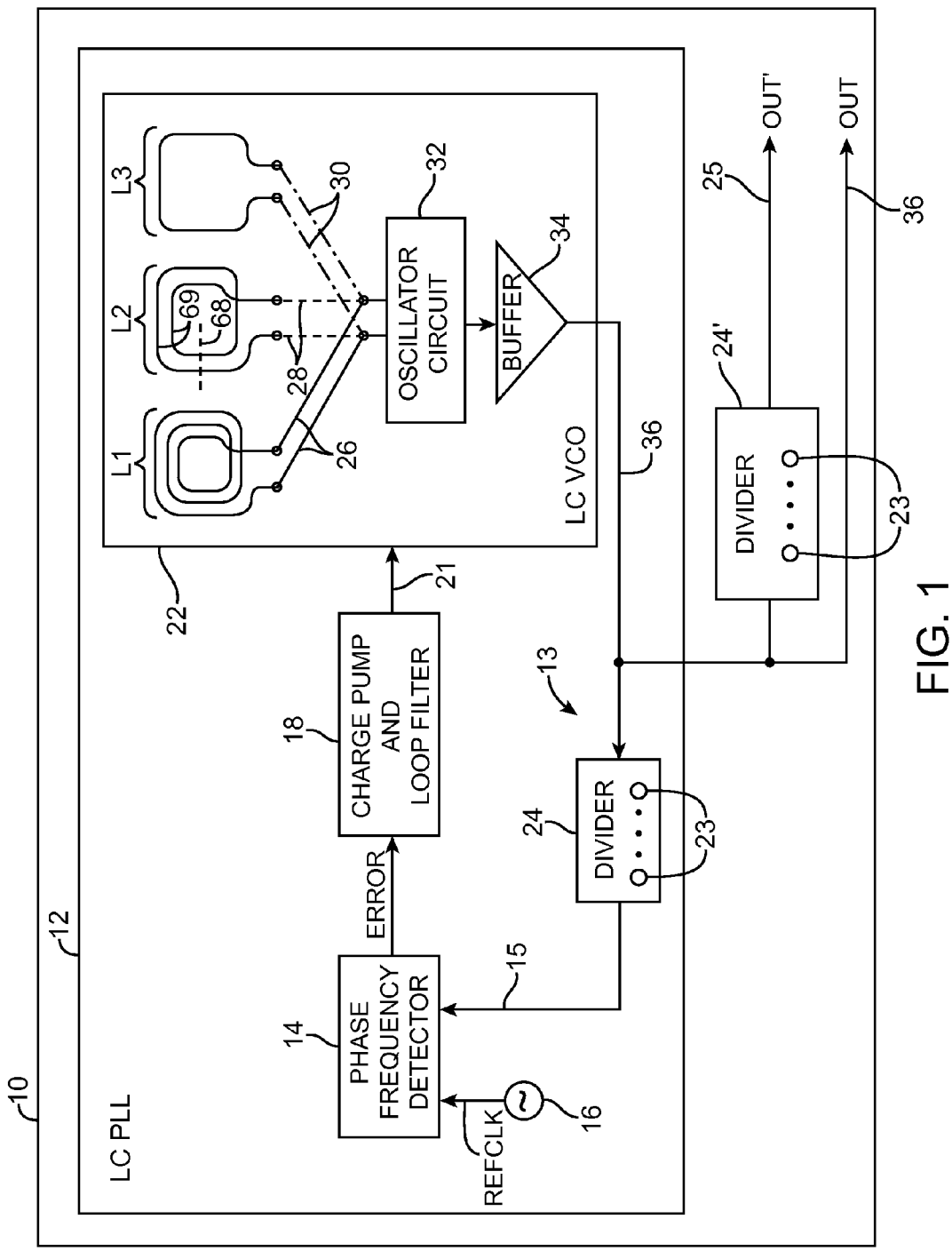
FIG. 1 is diagram of an illustrative phase-locked loop in accordance with an embodiment of the present invention.

An integrated circuit with configurable inductors such as an integrated circuit with wireless communications capabilities is shown in FIG. 1. Integrated circuit 10 may include wireless circuitry such as a phase-locked loop (PLL) 12, frequency mixers, filters, amplifiers, and other wireless circuits, and may therefore sometimes be referred to as a wireless integrated circuit.

Phase-locked loop 12 may be an LC-based phase-locked loop (e.g., a phase-locked loop that includes an inductor and a capacitor). For example, phase-locked loop 12 may include a varactor (a voltage-controlled capacitor) and a configurable inductor formed from multiple inductors of different sizes. Frequency tuning may be provided using a combination of inductance adjustments (e.g., to make relatively coarse frequency changes) and capacitance changes (e.g., to provide finer frequency changes). With this type of arrangement, an inductor may be configured to select a frequency range of interest, whereas varactor adjustments may be used to implement frequency tuning within a selected frequency range. Other configurations are also possible (i.e., arrangement in which coarse adjustments are made using varactors and fine adjustments are made using adjustable inductor circuits). Arrangements in which inductors are used for range selection are sometimes described herein as an example.

As shown in FIG. 1, phase-locked loop 12 includes a phase-frequency detector 14, an oscillator 16, charge pump and loop filter 18, a voltage-controlled oscillator 22, and a divider 24. Phase-frequency detector 14 may receive a reference clock signal REFCLK from oscillator 16. Oscillator 16 may be a crystal oscillator formed on integrated circuit 10. If desired, oscillator 16 may feed signals to a frequency divider (e.g., a counter) to generate signal REFCLK.

Phase-frequency detector 14 also receives a feedback signal from feedback path 13 at input 15. Phase-frequency detector 14 compares the signal on line 15 with signal REFCLK and generates a corresponding error control signal for charge pump and loop filter 18. The error signal directs the charge pump circuitry 18 to generate a higher or lower voltage on its output line 21, as needed to lock the frequency of circuit 12 to some integer multiple of the frequency of signal REFCLK.

Voltage-controlled oscillator 22 may have an input that is connected to line 21. Voltage-controlled oscillator 22 may generate a signal having a frequency that is controlled by adjusting the voltage level on line 21.

Voltage-controlled oscillator 22 may generate an output clock signal OUT over line 36. Line 36 is used to feed back output clock signal OUT from the voltage-controlled oscillator to divider 24. Divider 24 divides signal OUT by an appropriate integer (e.g., by two, by three, by five, etc.). Divider 24 preferably contains programmable elements 23, so that the integer setting of the divider can be adjusted during device programming.

The amount by which divider 24 divides clock signal OUT determines the ratio between the frequency of signal REFCLK and signal OUT. For example, signal REFCLK may have a given frequency, and line 36 may provide a locked output clock signal at a frequency of N times the given frequency. In a typical scenario, the frequency of REFCLK might be 400 MHz and the frequency of OUT might be 1.2 GHz (as an example).

Phase-locked loop 12 may be connected to a separate divider such as divider 24'. Divider 24' may also be formed in integrated circuit 10. Divider 24' may have an input that is connected to line 36 to receive clock signal OUT. Divider 24' may divide clock signal OUT by an appropriate integer (e.g., by two, by four, by eight, etc.) to produce another output clock signal OUT' on output line 25. Divider 24' preferably contains programmable elements 23 and can be adjusted during configuration of programmable logic device integrated circuit 10. Lines 25 and 36 may be connected to other wireless circuitry to provide other circuits with desired control clock signals.

As shown in FIG. 1, voltage-controlled oscillator 22 may include inductors such as inductor L1, inductor L2, and inductor L3. Inductors L1, L2, and L3 may be formed from loop-shaped traces in the metal routing layers and via layers in the dielectric stack of an integrated circuit. Inductors L1, L2, and L3 may each have a different number of turns. For example, inductor L1 may have three turns, inductor L2 may have two turns, and inductor L3 may have three turns (see, e.g., FIG. 1). Inductors L1, L2, and L3 may therefore have different (unique) inductance values, because inductance values depend on the number of turns in the inductors.

Voltage-controlled oscillator 36 may also include an oscillator circuit 32 and a buffer circuit 34. A selected one of the multiple inductors (e.g., inductors L1, L2, and L3) may be connected to oscillator circuit 32 through conductive routing lines. For example, inductor L1 may be connected to oscillator 32 through metal lines 26. In this scenario, inductors L2 and L3 are not connected to oscillator circuit 32. Inductor L1 connected to oscillator circuit 32 in this way may provide voltage-controlled oscillator 22 with a first tuning range.

The metal lines (e.g., lines 26) that configure the configurable inductor to produce a desired inductance value are formed during fabrication of integrated circuit 10. Once metal lines 26 have been formed to connect inductor L1 to oscillator circuit 32, this connection cannot be altered (i.e., the inductor has been configured to have a particular selected inductance value).

Because inductors L2 and L3 have different inductance values from inductor L1 and from each other, inductors L2 and L3 may be used to provide second and third tuning ranges, respectively. If it is desirable to operate voltage-controlled oscillator 22 in the second tuning range, metal lines 28 may be formed instead of lines 26 during fabrication of integrated circuit 10 (i.e., by selection of a photolithographic mask set that includes a pattern suitable for forming lines 28). When lines 28 are formed, lines 28 connect inductor L2 to circuit 32 (i.e., lines 28 switch inductor L2 into use in place of alternative inductors L1 and L3). If it is desirable to operate voltage-controlled oscillator 22 in the third tuning range, metal lines 30 may be formed instead of lines 26 and 28 during fabrication of integrated circuit 10 to connect inductor L3 to circuit 32. Generally, only one of the multiple inductors may be connected to oscillator circuit 32 at a time over a pair of associated metal lines. This provides voltage-controlled oscillator 22 with a desired frequency tuning range.

Oscillator circuit 32 may output signals to buffer circuit 34. Buffer circuit 34 may have an output that is connected to line 36 and may generate clock signal OUT at its output.

The voltage-controlled oscillator of FIG. 1 is merely illustrative. Any number of inductors may be formed to provide any number of frequency tuning ranges, if desired. Each inductor may have any desired number of turns.

Figure 2:
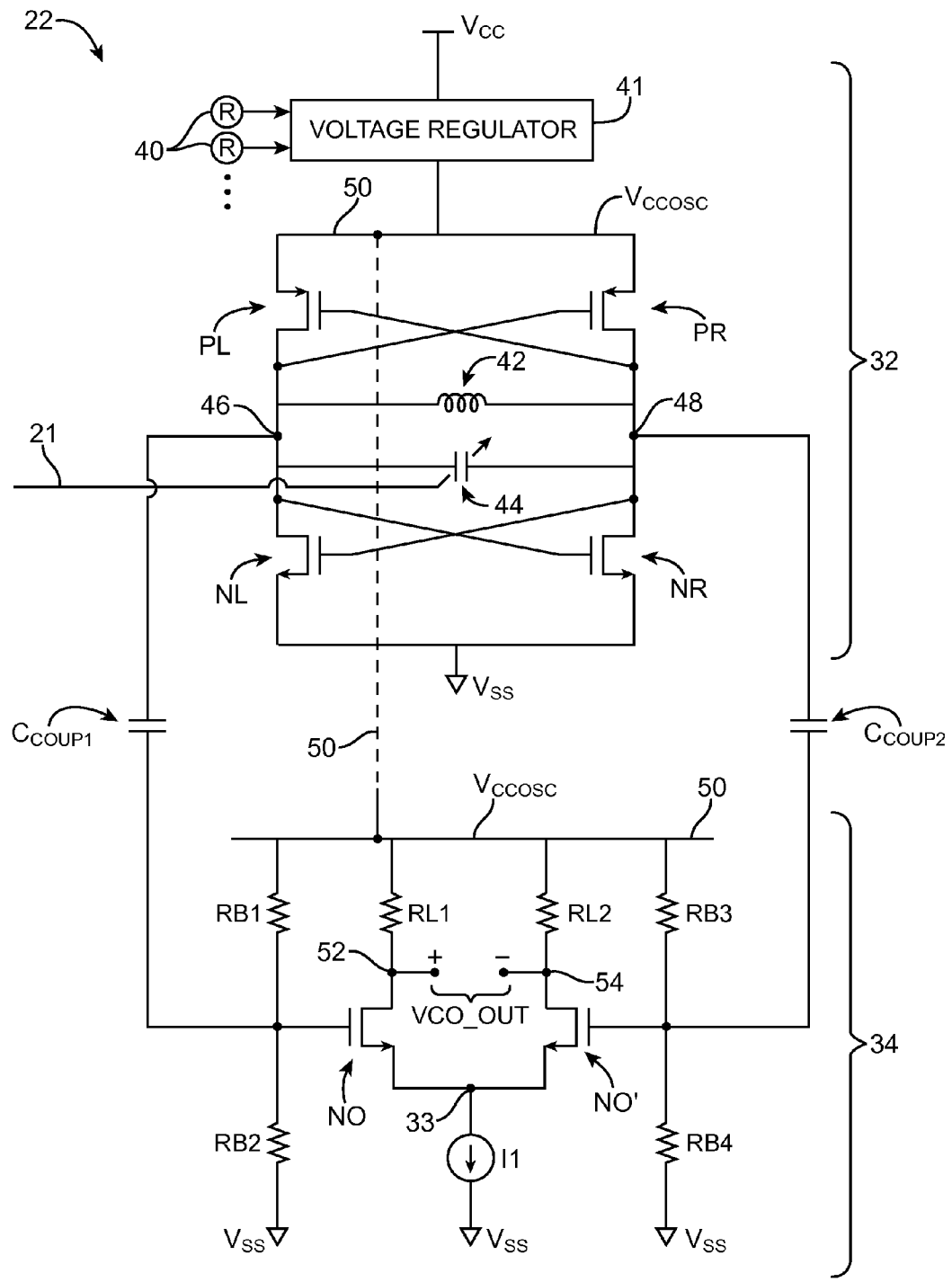
FIG. 2 is a circuit diagram of an illustrative voltage-controlled oscillator in accordance with an embodiment of the present invention.

FIG. 2 is a detailed circuit diagram of a voltage-controlled oscillator of the type described in connection with voltage controlled oscillator 22 of FIG. 1. Oscillator circuit 32 and buffer circuit 34 may be differential circuits. Voltage-controlled oscillator 22 may be powered by a positive power supply line (e.g., a power supply line that is driven to positive supply voltage Vcc) and a ground power supply line (e.g., a power supply line that is driven to ground voltage Vss). Positive supply voltage Vcc may be fed to a voltage regulator 41 to generate a regulated oscillator supply voltage Vccosc on an oscillator power supply line 50.

Voltage regulator 41 may be controlled by configuration bits (e.g., static control signals) stored in and supplied by storage elements such as random access memory (RAM) cells 40. The configuration bits can be used to set a desired voltage value for voltage Vssosc. RAM cells 40 may be configuration RAM (CRAM) cells that are loaded with configuration data on a programmable integrated circuit such as a programmable logic device integrated circuit (as an example). Any number of cells 40 may be used to control regulator 41. If desired, storage elements 40 may be implemented using nonvolatile memory elements (e.g., fuses, antifuses, electrically-programmable read-only memory elements, etc.).

For example, voltage regulator 41 may be configured (e.g., RAM cells 40 may be loaded with a given set of configuration bits) to generate an oscillator supply voltage Vccosc having a voltage value of 1.0 volts. If desired, voltage regulator 41 may be reconfigured (e.g., RAM cells 40 may be loaded with another set of configuration bits from an internal source or from an external source such as a configuration data loading chip, memory chip, etc.) so that supply voltage Vccosc has a voltage value of 0.9 volts, 0.8 volts, 0.75 volts, or other suitable voltage values.

Oscillator circuit 32 may include first and second transistor pairs, an inductor 42, and a variable capacitor 44 all coupled between power supply line 50 and the ground line (i.e., the ground power supply line). The first transistor pair may include a p-channel transistor PL and an n-channel transistor NL that are connected in series. The second transistor pair may include a p-channel transistor PR and an n-channel transistor NR that are connected in series. Source terminals of transistors PL and PR may be connected to supply line 50 while source terminals of transistors NL and NR may be connected to the ground line. Drain terminals of transistors PL and NL may be connected to a first intermediate node 46 while drain terminals of transistors PR and NR may be connected to a second intermediate node 48. Transistors PL and NL in the first transistor pair may have gate terminals (or gates) that are connected to intermediate node 48. Transistors PR and NR in the second transistor pair may have gates that are connected to intermediate node 46.

Inductor 42 may be connected between intermediate nodes 46 and 48. Inductor 42 is the inductor (e.g., inductor L1, L2, or L3 in FIG. 1) that was connected to oscillator circuit 32 through the associate metal lines during fabrication of integrated circuit 10. The unselected inductors (i.e., inductors L2 and L3 if inductor L1 was connected to circuit 32) are electrically disconnected from other circuitry (i.e., they are floating) and are not connected to circuit 32.

Variable capacitor 44 may be connected between intermediate nodes 46 and 48, as shown in FIG. 2. Variable capacitor 44 may sometimes be referred to as a varactor or a voltage-controlled capacitor. Varactor 44 may exhibit a capacitance value that is dependent on the voltage level provided over line 21. For example, consider a scenario in which the voltage level on line 21 increases. This increase in voltage may adjust varactor 44 to increase its capacitance level accordingly. Because oscillator circuit 32 includes inductor 42 and variable capacitor 44, circuit 22 may sometimes be referred to as an LC-based voltage-controlled oscillator.

Oscillator circuit 32 of FIG. 2 is merely illustrative. Any suitable type of oscillator circuit or other circuit that uses adjustable inductance value may include a configurable inductor, if desired.

Node 46 may be coupled to a first input of buffer circuit 34 through a first coupling capacitor $C_{COUP1}$. Node 48 may be coupled to a second input of buffer circuit 34 through a second coupling capacitor $C_{COUP2}$. Buffer circuit 34 may include n-channel transistors N0 and N0', load resistors RL1 and RL2, and a tail current source 11, as shown in FIG. 2. Transistor N0 and resistor RL1 may be connected in series between supply line 50 and a tail node 33. Transistor N0' and resistor RL2 may be connected in series between supply line 50 and tail node 33. Transistors N0 and N0' may have source terminals that are connected to tail node 33. Tail current source 11 may connect tail node 33 to the ground line.

Transistor N0 may have a gate that is connected to the first input of circuit 34. The first input of circuit 34 may be connected to supply line 50 through bias resistor RB1 and may be connected to the ground line through bias resistor RB2. Bias resistors RB1 and RB2 may serve to bias the first input of circuit 34 at a first bias voltage level that is dependent on ratio of the resistances of resistors RB1 and RB2.

Similarly, transistor N0' may have a gate that is connected to the second input of circuit 34. The second input of circuit 34 may be connected to supply line 50 through bias resistor RB3 and may be connected to the ground line through bias resistor RB4. Bias resistors RB3 and RB4 may serve to bias the second input of circuit 34 at a second bias voltage level that is dependent on ratio of the resistances of resistors RB3 and RB4.

Because N0 and N0' have gates that are connected to the inputs of circuit 34, transistors N0 and N0' may collectively be referred to as an input transistor pair.

Transistor N0 and resistor RL1 may be connected at an intermediate node 52. Transistor N0' and resistor RL2 may be connected at an intermediate node 54. Nodes 52 and 54 may collectively form a differential output VCO_OUT (e.g., an output of buffer circuit 34). Output VCO_OUT may be connected to line (path) 36 to provide signal OUT of FIG. 1. Signal OUT of FIG. 1 may therefore be a differential clock signal.

Transistors PL and PR may each have a body (bulk) terminal that is connected to an appropriate well bias such as the positive power supply line. Transistors NL, NR, N0, and N0' may each have a body terminal that is connected to an appropriate well bias such as the ground line. If desired, the body terminals of transistors PL, PR, NL, NR, N0, and N0' may be connected to their respective source terminals.

Figure 3:
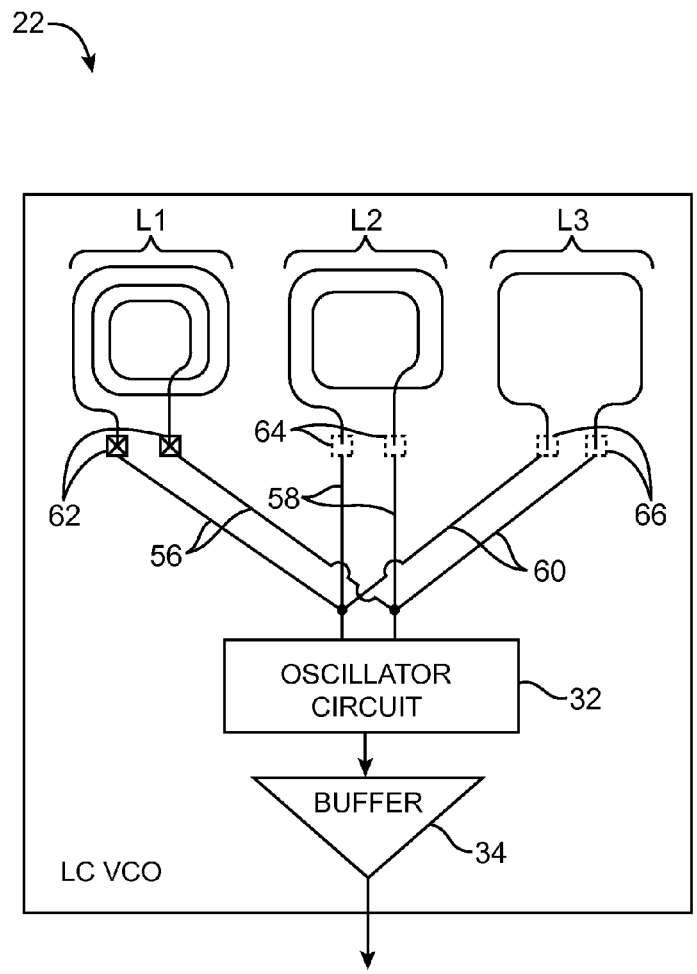
FIG. 3 is a diagram of an illustrative voltage-controlled oscillator with multiple inductors in accordance with an embodiment of the present invention.

FIG. 3 shows another suitable arrangement that may be used to implement an oscillator circuit such as voltage-controlled oscillator 22 of FIG. 1. Inductor structures L1, L2, and L3 may be formed in layers of a dielectric stack. The dielectric stack of an integrated circuit includes layers of silicon oxide or other dielectrics within which conductive structures are formed. A dielectric stack typically includes metal interconnect layers (also sometimes referred to as metal layers or metal routing layers) and via layers. The metal routing layers may include metal routing lines (also sometimes referred to as interconnects). The via layers may contain vertical conducting structures (e.g., conductive vias such as tungsten vias or other metal vias). If desired, metal may be omitted from a portion of a metal layer or via layer (e.g., to form a region of uninterrupted dielectric). Inductors 20 may be formed from metal lines in the metal routing layers and from vias in the via layers.

Inductors L1, L2, and L3 may be formed in a first metal routing layer (as an example). Metal lines such as lines 56, 58, and 60 may be formed in a second metal routing layer. The second metal routing layer may be below the first metal routing layer. Multiple metal routing layers and via layers may be interposed between the first and second metal routing layers. Vias such as vias 62 (e.g., a series of metal vias and metal stubs formed in the layers interposed between the first and second metal routing layers) may connect inductor L1 in the first metal layer to metal lines 56 in the second metal layer to provide oscillator 32 with a first tuning range. Only one of the multiple inductors may be connected to oscillator circuit 32 using this approach. If desired, vias such as vias 64 may connect inductor L2 (instead of inductor L1) in the first metal layer to metal lines 58 in the second metal layer to provide oscillator 32 with a second tuning range. If desired, vias 66 may be formed to connect inductor L3 (instead of inductor L1) in the first metal layer to metal lines 60 in the second metal layer to provide oscillator 32 with a third tuning range. In general, only one set of vias (e.g., vias 62, 64, or 66) may be formed to connect a respective inductor to oscillator circuit 32.

Figure 4:
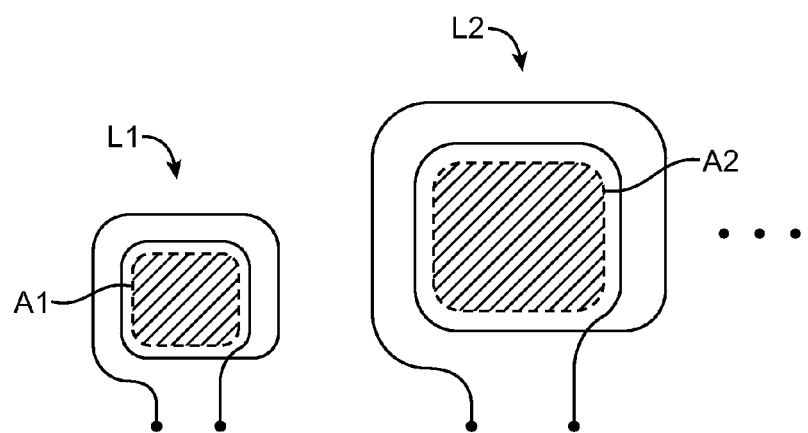
FIG. 4 is a diagram of illustrative inductors with different sizes in accordance with an embodiment of the present invention.

The inductors in voltage-controlled oscillator 22 may have different sizes to provide different inductance values. As shown in FIG. 4, inductor L1 may have an internal area A1 (e.g., a region within the inductor that is surrounded by the conductive lines used to form the inductor and that is devoid of the conductive lines of the inductor) while another inductor L2 may have an internal area A2 that is greater than area A1. In general, any number of inductors with any desired size (e.g., internal area) may be formed on integrated circuit 10.

Figure 5:
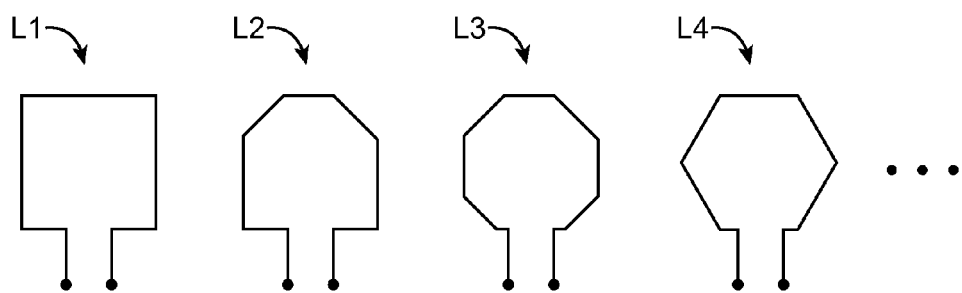
FIG. 5 is a diagram of illustrative inductors with different shapes in accordance with an embodiment of the present invention.

The inductors in voltage-controlled oscillator 22 may have different shapes to provide different inductance values. As shown in FIG. 5, inductor L1 may have a square shape, inductor L2 may have an irregular hexagonal shape, inductor L3 may have an octagonal shape, inductor L4 may have a regular hexagonal shape, etc. In general, any number of inductors with any desired shapes (e.g., shapes having any number of 90° bends, 45° bends, etc.) may be formed on integrated circuit 10.

An important inductor metric is inductor quality factor Q. The quality factor Q of an inductor is the ratio of the energy stored in the inductor to the energy dissipated by the inductor. Inductors with low Q values are inefficient and can degrade circuit performance. The value of Q may be affected by the resistance of the conductive lines used to form the inductor. Conductors with relatively higher resistance may produce inductors with poorer Q values. Conductors with relative lower resistance may produce inductors with higher Q values.

Figure 6:
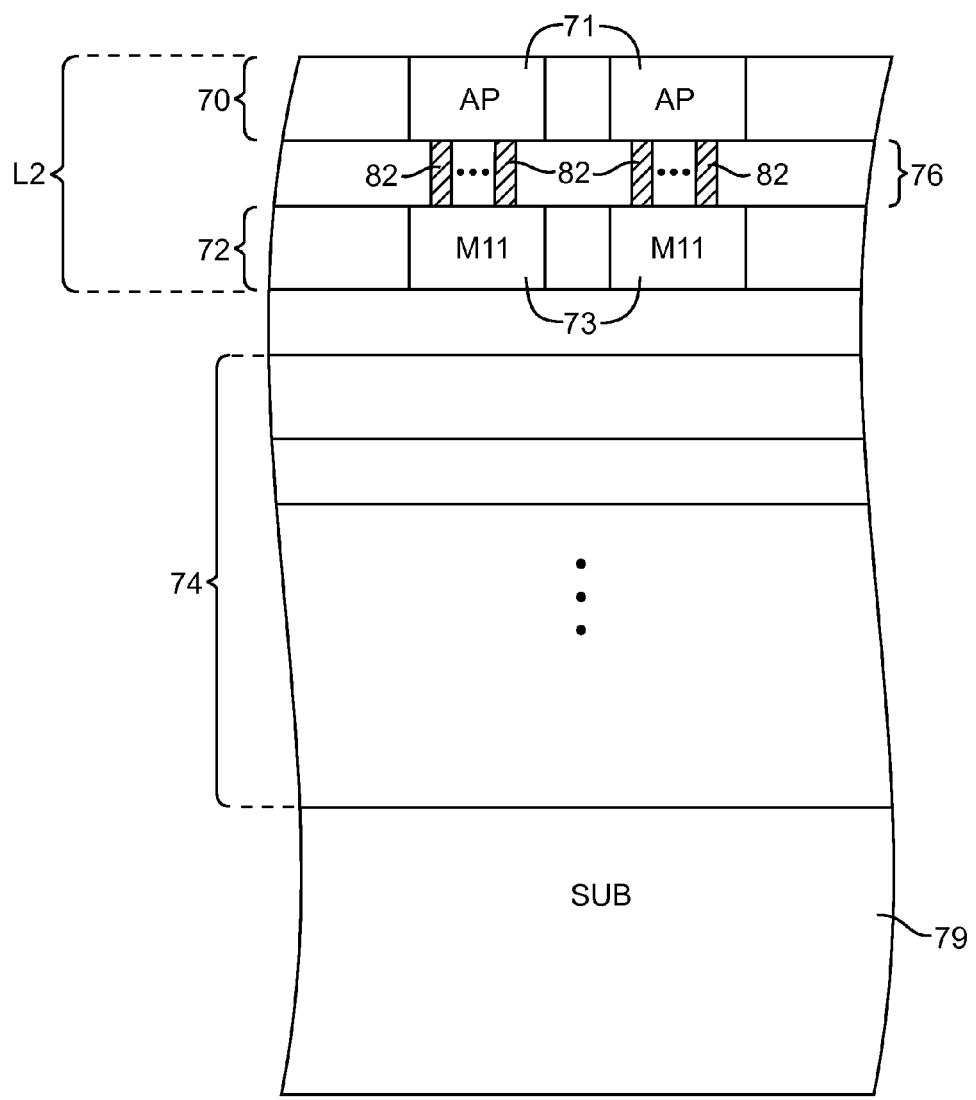
FIG. 6 is a cross-sectional side view of an illustrative inductor with conductive lines shorted in parallel in accordance with an embodiment of the present invention.

The conductive lines that are used to form each inductor may be formed using traces in two (or more) metal routing layers shorted to each other in parallel to reduce resistance and thereby improve Q, as shown in FIG. 6. FIG. 6 is a cross-sectional side view of inductor L2 of FIG. 1 sectioned along a cross-sectional cut on dotted line 68. Loop-shaped metal lines 69 of inductor L2 in FIG. 1 may include metal loop-shaped lines 71 and 73 which run parallel to each other and are shorted in parallel by interposed vias 82. Metal lines 71 and 73 may be respectively formed in metal routing layers 70 and 72 while vias 82 may be formed in via layer 76.

For example, metal lines 71 and 73 may be formed in an aluminum pad (AP) metal routing layer and an M11 metal routing layer, respectively (e.g., assuming integrated circuit 10 is formed using an eleven-layer interconnect technology as an example). Other circuitry or metal routing may be formed in region 74 below the inductor, if desired. Region 74 may include the remaining metal routing layers and via layers in the dielectric stack formed over substrate 79.

Figure 7:
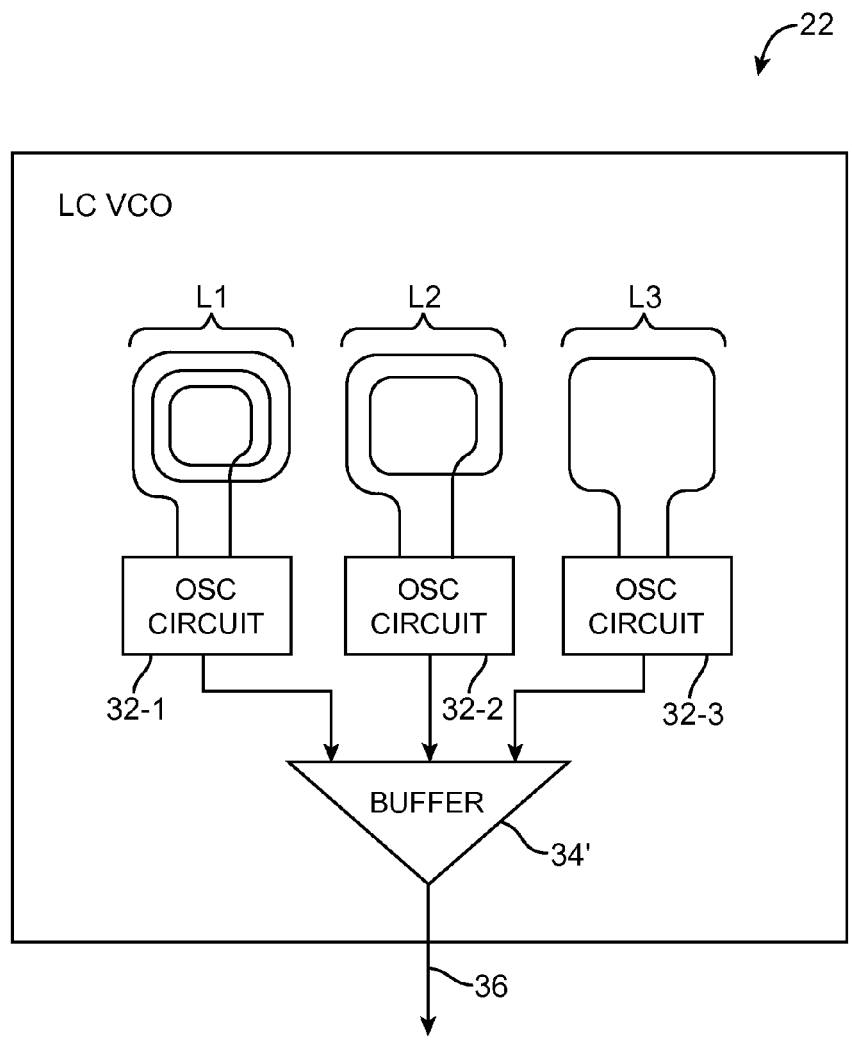
FIG. 7 is a block diagram of an illustrative voltage-controlled oscillator with multiple inductors connected to respective oscillator circuits in accordance with an embodiment of the present invention.

Another suitable arrangement for a voltage-controlled oscillator of the type described in connection with FIG. 1 is shown in FIG. 7. In configurations of the type shown in FIG. 7, each inductor may have a corresponding dedicated oscillator circuit (i.e., the inductor structures are not switched into use by themselves, but rather are switched into use in conjunction with associated circuitry that is also being switched into use). For example, inductor L1 may be connected to oscillator circuit 32-1, inductor L2 may be connected to oscillator circuit 32-2, and inductor L3 may be connected to oscillator circuit 32-3. Oscillator circuits 32-1, 32-2, and 32-3 may have outputs that are connected to a buffer circuit 34'. Buffer circuit 34' may be able to receive signals from a selected one of the multiple oscillator circuits (e.g., using electrical switching techniques, mask-programming techniques, selective power supply adjustment techniques, or other suitable circuit configuration techniques). If desired, a different number of oscillator circuits may be connected to buffer circuit 34'. The use of three oscillator circuits in the example of FIG. 7 is merely illustrative.

Figure 8:
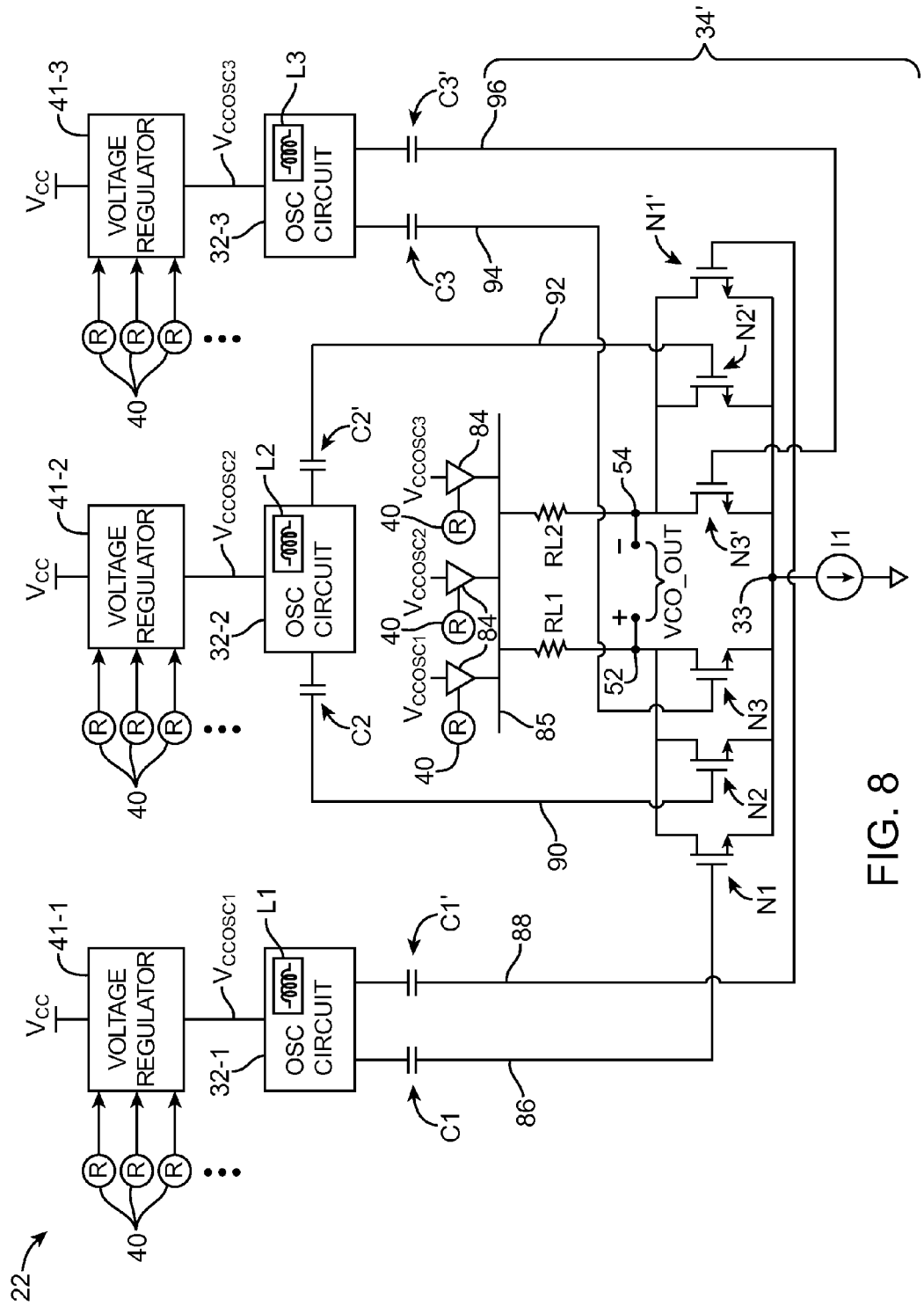
FIG. 8 is a circuit diagram of an illustrative voltage-controlled oscillator of the type shown in connection with FIG. 7 in accordance with an embodiment of the present invention.

FIG. 8 is a circuit diagram of voltage-controlled oscillator 22 of FIG. 7. Oscillator circuits 32-1, 32-2, and 32-3 may include inductors L1, L2, and L3, respectively. Oscillator circuits 32-1, 32-2, and 32-3 may be powered respectively by voltage regulators 41-1, 41-2, and 41-3. Voltage regulators 41-1, 41-2, and 41-3 may each be controlled by configuration bits from associated CRAM cells 40 or other suitable programmable memory elements to provide respective oscillator supply voltages. Voltage regulators 41-1, 41-2, and 41-3 may supply oscillator supply voltages Vccosc1, Vccosc2, and Vccosc3 to oscillator circuits 32-1, 32-2, and 32-3, respectively.

Only one of the oscillator circuits may be active (i.e., enabled by being turned on and thereby selected for use) during normal operation of voltage-controlled oscillator 22. The active oscillator circuit may receive a high oscillator supply voltage (e.g., a voltage that is higher than 0.8 volts) from the associated voltage regulator. The remaining oscillator circuits may be disabled (i.e., turned off and inactive). The disabled oscillator circuits may receive a low supply voltage (e.g., zero volts) from the associated voltage regulators. Turning on and off blocks of circuitry that contain different inductance values therefore serves as a type of programming or configuration operation that may be performed to select which inductor structure is active in the circuit and thereby adjust the oscillator.

For example, consider a scenario in which it is desired to activate oscillator circuit 32-2. In this example, voltage regulator 41-2 may drive voltage Vccosc2 to 1.0 volts while voltage regulators 41-1 and 41-3 disable oscillators 32-1 and 32-3 by supplying oscillators 32-1 and 32-3 with zero volts (e.g., Vccosc1 is zero volts and Vccosc3 is zero volts).

Buffer circuit 34' may be powered by buffer power supply line 85 and the ground line. Supply line 85 may be driven by tri-state buffers such as tri-state buffers 84. A first tri-state buffer 84 may have an input that receives voltage Vccosc1. A second tri-state buffer 84 may have an input that receives voltage Vccosc2. A third tri-state buffer 84 may have an input that receives voltage Vccosc3. Each tri-state buffer may be controlled by a corresponding data bit stored on a RAM cell 40. A selected one of the tri-state buffers may be enabled to drive buffer power supply line 85 to a desired voltage during normal operation.

For example, consider a scenario in which it is desired to activate oscillator circuit 32-3 (e.g., regulator 41-3 drives Vccosc3 to 1.0 volts while regulator 41-1 and 41-2 drive Vccosc1 and Vccosc2 to zero volts). The corresponding tri-state buffer 84 that receives voltage Vccosc3 may be enabled (e.g., by loading the memory cell that controls the associated tri-state buffer with a "1") to drive line 85 to Vccosc3 (as an example). In this example, the remaining tri-state buffers may be disabled (e.g., by loading the memory cells that control the remaining tri-state buffers with a "0").

A first load resistor RL1 may be connected between supply line 85 and first output node 52. A second load resistor RL2 may be connected between line 85 and second output node 54. N-channel transistors such as transistors N1, N2, and N3 may be connected in parallel between node 52 and a tail node 33. N-channel transistors such as transistors N1', N2', and N3' may be connected in parallel between node 54 and tail node 33. Tail current source 11 may connect tail node 33 to the ground line.

Transistors N1 and N1' may represent an input transistor pair (as an example). Transistors N2 and N2' may be another input pair. Each oscillator circuit may have first and second outputs that are coupled to respective gate terminals of a corresponding input transistor pair.

For example, oscillator circuit 32-1 may have a first output that is coupled to the gate of transistor N1 through coupling capacitor C1. Oscillator circuit 32-1 may have a second output that is coupled to the gate of transistor N1' through coupling capacitor C1'. Oscillator circuit 32-2 may have a first output that is coupled to the gate of transistor N2 through coupling capacitor C2. Oscillator circuit 32-2 may have a second output that is coupled to the gate of transistor N2' through coupling capacitor C2'. Oscillator circuit 32-3 may have a first output that is coupled to the gate of transistor N3 through coupling capacitor C3. Oscillator circuit 32-3 may have a second output that is coupled to the gate of transistor N3' through coupling capacitor C3'.

Voltage-controlled oscillator 22 of FIG. 8 is merely illustrative. Any number of oscillator circuits may be coupled to a corresponding number of input transistor pairs in buffer circuit 34'.

Nodes 52 and 54 may collectively form a differential output VCO_OUT (e.g., an output of buffer circuit 34'). Output VCO_OUT may be connected to line 36 to provide clock signal OUT of FIG. 1.

Figure 9:
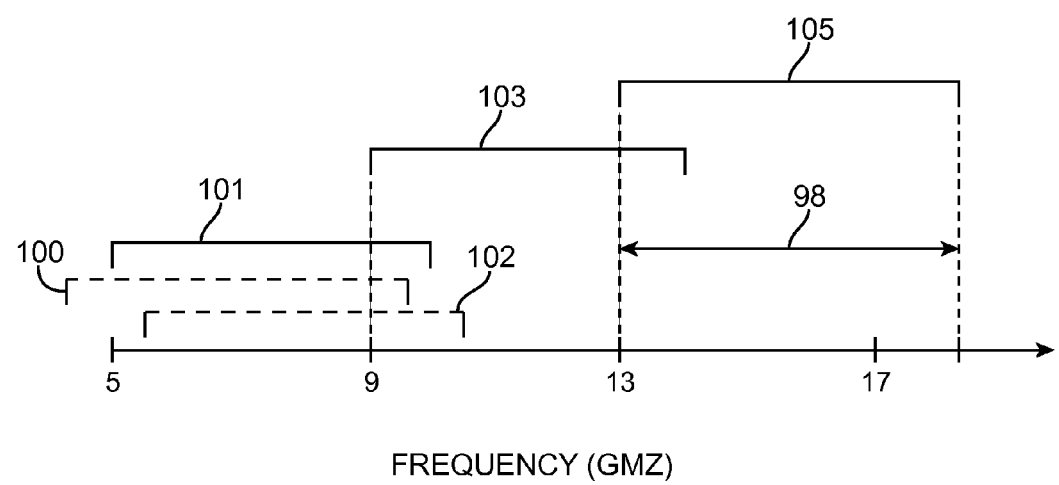
FIG. 9 is a diagram showing possible frequency ranges that can be obtained by a phase-locked loop in accordance with an embodiment of the present invention.

Voltage-controlled oscillators of the types described in connection with FIGS. 1, 3, and 7 may be used to provide three partly overlapping frequency ranges, as shown in FIG. 9. For example, if inductor L1 were actively connected to the oscillator circuit (e.g., if oscillator 32-1 is turned on and oscillators 32-2 and 32-3 are turned off), the phase-locked loop may have a first operating frequency range as indicated by range 101 (e.g., from 5 GHz to 10 GHz). If inductor L2 were actively connected to the oscillator circuit, the phase-locked loop may have a second operating frequency range as indicated by range 103 (e.g., from 9 GHz to 14 GHz). If inductor L3 were actively connected to the oscillator circuit, the phase-locked loop may have a third operating frequency range as indicated by range 105 (e.g., from 13 GHz to 18 GHz).

Ranges 101, 103, and 105 may be partly overlapping to provide margin to compensate for potential process variations. Varactor 44 of the oscillator circuit (see, e.g., FIG. 2) may be tuned to operate the phase-locked loop at any desired frequency within the frequency range provided by the selected inductor. For example, in a scenario in which inductor L3 is connected to the oscillator circuit, varactor 44 could be tuned to provide the phase-locked loop with any operating frequency within range 105, as indicated by arrow 98.

The frequency range of the phase-locked loop may be further adjusted by tuning the associated voltage regulator. Varying the oscillator supply voltage generated by the voltage regulator (e.g., by reconfiguring RAM cells 40 that control the voltage regulator) may shift the frequency range, as indicated by shifted ranges 100 and 102 in FIG. 9.

The operating frequency range shown in FIG. 9 is merely illustrative. Any desired frequency range may be covered by any suitable number of inductors. The operating frequencies may be shifted and adjusted by any amount by tuning the associated varactor and voltage regulator, if desired.

The foregoing is merely illustrative of the principles of this invention and various modifications can be made by those skilled in the art without departing from the scope and spirit of the invention.

What is claimed is:

1. An integrated circuit, comprising:
 a plurality of oscillator circuits each having a respective inductor with a unique corresponding inductance value and each having a respective oscillator circuit output;
 a buffer circuit having a plurality of input transistors, wherein each respective oscillator circuit output is coupled to a respective input transistor in the plurality of input transistors; and
 a resistive load having first and second terminals, wherein the first terminal of the resistive load is coupled to a power supply line, and wherein the second terminal of the resistor load is coupled to each input transistor in the plurality of input transistors.

2. The integrated circuit defined in claim 1 further comprising a phase-locked loop, wherein a selected oscillator circuit in the plurality of oscillator circuits is active and forms part of the phase-locked loop with the buffer circuit.

3. The integrated circuit defined in claim 2, wherein each oscillator circuit other than the selected is inactive.

4. The integrated circuit defined in claim 3, further comprising a plurality of voltage regulators, wherein each voltage regulator in the plurality of voltage regulators is associated with a respective oscillator circuit in the plurality of oscillator circuits, wherein a voltage regulator in the plurality of voltage regulators that is associated with the selected oscillator circuit activates the selected oscillator circuit by applying power to the selected oscillator circuit, and wherein each oscillator circuit other than the selected oscillator circuit is unpowered by its associated voltage regulator.

5. The integrated circuit defined in claim 4, further comprising a plurality of programmable elements, wherein each programmable element in the plurality of programmable elements produces a corresponding static control signal in a plurality of static control signals, and wherein the voltage regulators are controlled by the plurality of static control signals.

6. The integrated circuit defined in claim 1, further comprising coupling capacitors that connect the oscillator circuit outputs to the plurality of inputs of the buffer circuit.

7. The integrated circuit defined in claim 1, wherein the plurality of oscillator circuits and the circuit are differential circuits.

8. Tunable oscillator circuitry formed on an integrated circuit having a dielectric stack with a pad layer, comprising:
   a plurality of oscillator circuits, wherein each oscillator circuit in the plurality of oscillator circuits includes a respective inductor in a plurality of inductors;
   voltage regulator circuitry that selectively activates a given oscillator circuit in the plurality of oscillator circuits; and
   a buffer circuit having first input transistors and second input transistors, wherein the first input transistors have gates that are coupled to corresponding outputs of a first oscillator circuit in the plurality of oscillator circuits, wherein the second input transistors have gates that are coupled to corresponding outputs of a second oscillator circuit in the plurality of oscillator circuits, and wherein the first and second input transistors are coupled to a shared tail transistor.

9. The tunable oscillator circuitry defined in claim 8 wherein:
   the voltage regulator circuitry includes a plurality of voltage regulators, wherein each voltage regulator in the plurality of voltage regulators is coupled to a respective oscillator circuit in the plurality of oscillator circuits; and
   the voltage regulator circuitry includes programmable elements that direct a given voltage regulator in the plurality of voltage regulators to activate the given oscillator circuit by supplying power to the given oscillator circuit and that direct each voltage regulator other than the given voltage regulator to inactivate the oscillator circuit that is connected to that voltage regulator by blocking power from the oscillator circuit that is connected to that voltage regulator.

10. The tunable oscillator circuitry defined in claim 9, further comprising a phase-locked loop, wherein the given oscillator circuit forms part of the phase-locked loop.

11. The tunable oscillator circuitry defined in claim 10, wherein each oscillator circuit in the plurality of oscillator circuits includes an adjustable capacitor.

12. The tunable oscillator circuitry defined in claim 8, wherein each oscillator circuit in the plurality of oscillator circuits has an adjustable capacitor and has first and second oscillator outputs.

13. The tunable oscillator circuitry defined in claim 12, wherein the first and second input transistors are coupled to the corresponding outputs of the first and second oscillator circuits via coupling capacitors.

14. An integrated circuit comprising:
   a first oscillator circuit having a first inductor with a first inductance value;
   a second oscillator circuit having a second inductor with a second inductance value that is different than the first inductance value; and
   a buffer circuit having first input transistors and second input transistors, wherein the first and second input transistors each have a source terminal and a drain terminal, wherein the source terminal of the first input transistor is shorted to the source terminal of the second input transistor, wherein the drain terminal of the first input transistor is shorted to the drain terminal of the second input transistor, wherein the first input transistors have gates that are coupled to corresponding outputs of the first oscillator circuit and wherein the second input transistors have gates that are coupled to corresponding outputs of the second oscillator circuit.

15. The integrated circuit defined in claim 14 further comprising:
   a first capacitor coupled between the outputs of the first oscillator circuit and the gates of the first input transistors; and
   a second capacitor coupled between the outputs of the second oscillator circuit and the gates of the second input transistors.

16. The integrated circuit defined in claim 14 further comprising:
   a first programmable voltage regulator operable to supply a first power supply voltage to the first oscillator circuit; and
   a second programmable voltage regulator operable to supply a second power supply voltage that is lower than the first power supply voltage to the second oscillator circuit.

17. The integrated circuit defined in claim 16 wherein the buffer circuit includes a power supply terminal coupled to the first and second programmable voltage regulators through corresponding tri-state buffers, wherein only a selected one of the tri-state buffers is activated.

18. The integrated circuit defined in claim 14 wherein the first oscillator circuit further includes a first capacitor coupled in parallel with the first inductor and wherein the second oscillator circuit further includes a second capacitor coupled in parallel with the second inductor.

19. The integrated circuit defined in claim 18 wherein the first and second capacitors comprise adjustable capacitors.

20. The integrated circuit defined in claim 18 wherein each of the first and second oscillator circuits further comprises at least one cross-coupled transistor pair.

* * * * *